United States Patent
Peidous et al.

(10) Patent No.: US 6,249,035 B1
(45) Date of Patent: Jun. 19, 2001

(54) LOCOS MASK FOR SUPPRESSION OF NARROW SPACE FIELD OXIDE THINNING AND OXIDE PUNCH THROUGH EFFECT

(75) Inventors: Igor V. Peidous; Quek Kiok Boone Elgin; Konstantin V. Loiko; Tan Poh Suan, all of Singapore (SG); Vijai Kumar N. Chhagan, Belgrave (GB)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/480,268

(22) Filed: Jan. 11, 2000

Related U.S. Application Data

(62) Division of application No. 09/017,141, filed on Feb. 2, 1998.

(51) Int. Cl.[7] .............................. H01L 29/00; H01L 21/76
(52) U.S. Cl. ......................... 257/506; 438/424; 438/439
(58) Field of Search .............................. 257/506; 438/424, 438/439, 431

(56) References Cited

U.S. PATENT DOCUMENTS

| | | | |
|---|---|---|---|
| 4,965,221 | * 10/1990 | Dennison et al. | |
| 5,397,733 | 3/1995 | Jang | 437/69 |
| 5,453,397 | 9/1995 | Ema et al. | 437/69 |
| 5,470,783 | 11/1995 | Chiu et al. | 437/72 |
| 5,472,906 | 12/1995 | Shimizu et al. | 437/72 |
| 5,670,017 | * 9/1997 | Hashimoto | |
| 5,895,254 | * 4/1999 | Huang et al. | |
| 6,096,583 | * 9/2000 | Iwamatsu et al. | |
| 6,103,596 | * 9/2000 | Peng | |

OTHER PUBLICATIONS

S. Wolf, "Silicon Processing For The VLSI Era" vol. 2, 1990, Lattice Press, Sunset Beach, CA, p 693.
P. Belluti et al. "Oxide Growth Effects in Micron and Submicron Field Regions", Electrochem. Soc. 143(1996)p 2953.

* cited by examiner

Primary Examiner—John F. Niebling
Assistant Examiner—Ron Pompey
(74) Attorney, Agent, or Firm—George O. Saile; Rosemary L. S. Pike

(57) ABSTRACT

A novel design of an oxidation mask for improved control of birds beak and more specifically for tailoring and smoothing the field oxide isolation profile in the vicinity of the birds beak. The mask design is particularly advantageous for narrow field isolation spacings found in sub half-micron integrated circuit technology. The mask uses a thin tapered silicon nitride foot along its lower edge to allow nominal expansion of the oxide during the early stages of oxidation, thereby permitting in-situ stress relief as well as a smoothing of the oxide profile. The taper of the foot provides a gradual increase in mask stiffness as oxidation proceeds under the mask edge, allowing greatest flexibility during the early rapid growth period followed by increasing stiffness during the later stages when the growth rate has slowed, thereby inhibiting the penetration of birds beak. Shear stresses responsible for dislocation generation are reduced by as much as fifty fold. This stress reduction is accompanied by an improvement in surface topography as well as suppression of oxide punch though and the narrow oxide thinning effect.

3 Claims, 4 Drawing Sheets

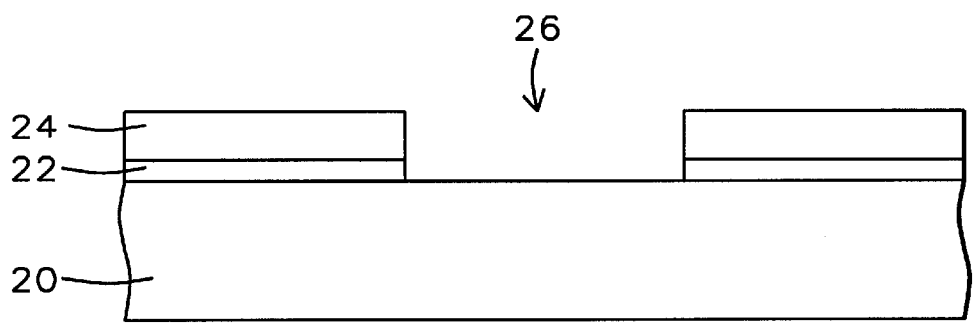
FIG. 1 – Prior Art
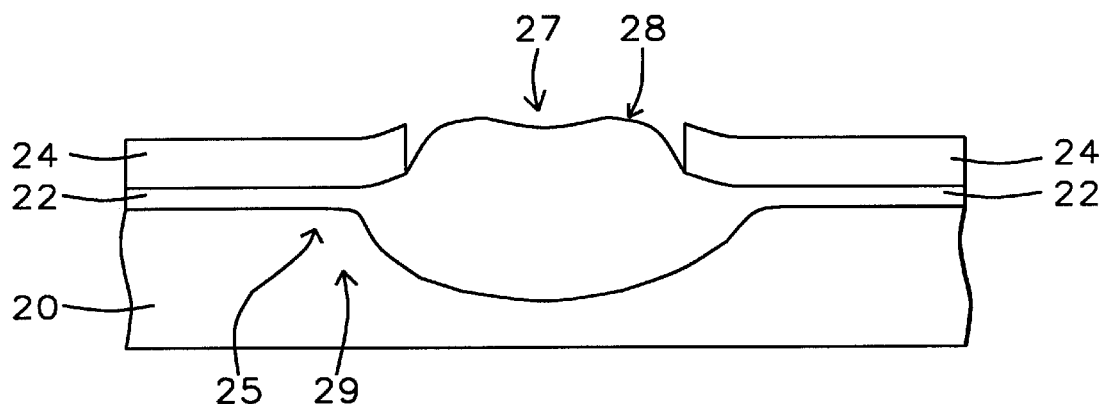
FIG. 2 – Prior Art
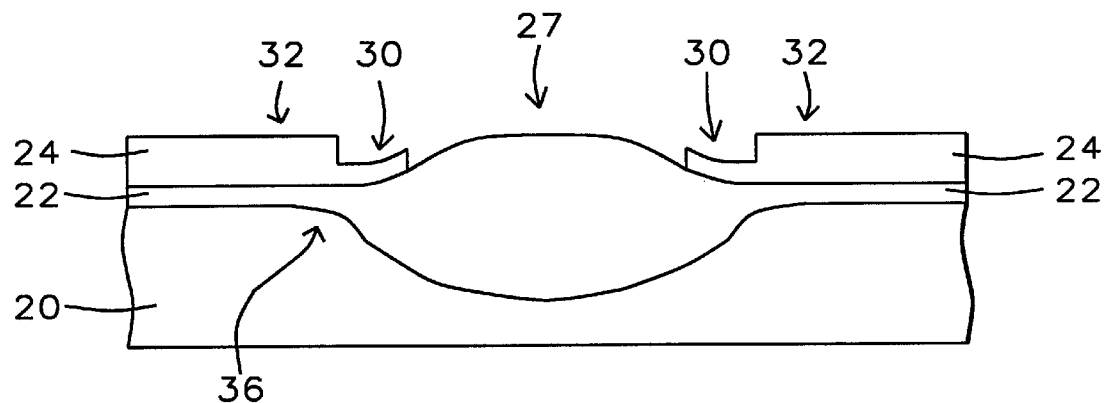
FIG. 3 – Prior Art

LOCOS MASK FOR SUPPRESSION OF NARROW SPACE FIELD OXIDE THINNING AND OXIDE PUNCH THROUGH EFFECT

This is a division of patent application Ser. No. 09/017,141, filing date Feb. 2, 1998, A Locos Mask For Suppression Of Narrow Space Field Oxide Thinning And Oxide Punch Through Effect, assigned to the same assignee as the present invention.

BACKGROUND OF THE INVENTION (1) Field of the Invention

The invention relates to processes for the manufacture of semiconductor devices and more particularly to processes for forming field isolation.

(2) Description of Prior Art

The formation of integrated circuit devices on silicon substrates requires that a means be provided to electrically isolate the various circuit components from each other. In many cases p/n junctions themselves can be used to form at least part of the necessary isolation. Most isolation requirements, which cannot be resolved by circuit design, relate to the lateral isolation of devices. To some extent, junction isolation can be used here also. However, as device technology leads to smaller and smaller geometries as well as shallower structures, junction isolation technology becomes very limited.

The successful use of silicon for integrated circuits for the last thirty years can, in part, be attributed to the marvelous insulating properties of it's oxide. No other commonly known semiconductor material has this unique feature. Thus silicon oxide has become well established as the isolation material for integrated circuit chips. Earliest usage of this material involved growing it on the substrate in selected regions which are defined by an oxidation masking material. To this end, silicon nitride came into widespread use. Referring to FIG. 1, a pad silicon oxide film 22 several hundred Angstroms thick is grown on the surface of a silicon wafer 20. Next a film of silicon nitride 24 is deposited to a thickness of several thousand Angstroms using a chemical-vapor-deposition process. The pad oxide 22 is used as a buffer layer, preventing the highly stressed silicon nitride from causing dislocations in the silicon.

Using standard photolithographic techniques followed by etching, a pattern is defined in the oxide/nitride mask, leaving bare those regions 26 on the silicon which are to become isolation regions. Referring next to FIG. 2, the wafer 20 is subjected to an oxidizing ambient at elevated temperatures, during which the exposed areas are converted to silicon oxide 28. The oxidation proceeds at the oxide-silicon interface. Thereby pockets of silicon oxide 27 several thousand Angstroms deep can be formed in the patterned areas. These pockets 27 provide the necessary electrical isolation for the subsequently formed semiconductor devices.

The process just described has become known by several names, one of which is LOCOS an acronym for Local Oxidation of Silicon. LOCOS has been practiced for over twenty-five years and has been adapted to many specific applications. One of the problems with conventional LOCOS, illustrated in FIG. 2 is that the pad oxide 22 permits oxidation to take place under the silicon nitride mask, pushing up the edge of the mask and thereby leaving a raised portion of the oxide around the mask perimeter, known as "Birds Head" 28 and a protrusion of oxide under the edge of the oxidation mask 29, caused by diffusion of oxidant through the thin pad oxide 22, known as "Birds Beak". The birds head 28, being a protrusion above the surface, causes shadowing and thinning problems with subsequently deposited metallization stripes traversing across it. Thin areas in metal interconnection lines constitute "weak spots" and are subject to increased current density, heating, and subsequent electrical failure. The birds beak 29 can be reduced by using as thin as possible pad oxide 22 or by stiffening the mask by using a thicker silicon nitride layer 24.

In some instances, a sidewall oxidation barrier is formed along the mask edge to prevent penetration of the oxidant under the nitride mask. Ema et.al. U.S. Pat. No. 5,453,397 describes such a barrier wherein a nitride plug is formed in a recess produced by undercutting the pad oxide with a wet etch. Shimizu, et.al., U.S. Pat. No. 5,472,906 form a nitride barrier which extends over the edge of the pad oxide and over the edge of a subjacent depression in the silicon. Unfortunately, these practices lead to an abrupt feature 25 wherein high shearing stresses are produced in the silicon which lead to the formation of dislocations. These dislocations propagate diagonally into the device active regions causing junction failure.

Typically, the field oxide is grown at temperatures above 1,000° C. At these temperatures, stresses which would be developed due to the volume expansion, are relieved by plastic flow of the oxide. However, upon completion of the oxidation, and when the wafer is cooled, sufficient plastic flow is no longer able to relieve stresses below about 960° C. (Wolf, S., "Silicon Processing for the VLSI Era", Vol.2, Lattice Press, Sunset Beach, Calif., (1990),p693). Thermal stresses now develop due to the difference in thermal expansion coefficients of the silicon oxide and the silicon. The profile of the field oxide is now the determining factor for the distribution of stresses within the silicon. Abrupt features in the silicon/silicon oxide profile, such as 25 in FIG. 2, are responsible for high values of x-y shearing stresses which produce dislocations. Such abrupt features 25 occur when a stiff mask edge is used to control the field oxidation.

The compressive stresses developed within the growing field oxide also have been observed to retard the oxidation rate of silicon. Known as the field oxide thinning effect, this phenomena is observed when field oxide is grown in mask openings below about 0.5 to 0.6 microns. See for example, P. Belluti and M. Zen in J. Electrochem. Soc. 143, (1996) p 2953.

Efforts to diffuse the abruptness of a stiff mask edge and to control the extent of birds beak encroachment into the silicon active area as well as the shape of the birds head, have been made using "L" shaped spacers which form a foot at the mask edge. Jang US5,397,733 describes several embodiments by which these spacers can be formed. An example of the use of such a spacer is shown in FIG. 3. The nitride foot 30 surrounding the periphery of the thicker nitride mask provides a region of more flexible mask at the edge of the opening, thereby allowing easier expansion of the growing field oxide under it. The thicker, and therefore stiffer, section 32 continues to constrict the birds beak.

By proper selection of the thickness and length of the mask foot 30 as well as the thickness of the more rigid portion 32, it becomes possible to tailor the mask edge to provide a field oxide profile 36 with reduced stress at the expense of minimal birds beak encroachment. Jang cites prior art difficulties in forming the L-shaped spacer, specifically, difficulties in controlling thickness and length of the spacer.

In one embodiment cited by Jang a nitride foot is formed by first depositing a silicon nitride layer over a pad oxide, thinning a region of the nitride layer to form a step, depositing a polysilicon layer over the step, and applying a spacer etch which forms a polysilicon spacer at the edge of the region. The nitride layer is then etched into the pad oxide using the polysilicon spacer to protect the nitride foot. The polysilicon spacer is subsequently removed from over the foot, permitting the foot to flex during the field oxidation.

The precise tailoring of the field oxidation mask edge becomes even more critical as device geometries shrink into the sub-half micron range. As field oxide widths approach these dimensions oxidation rates are significantly retarded and stress induced crystalline defects cause serious degradation of the semiconductor devices. The balance between reducing birds beak encroachment and preventing stress induced dislocations requires an even greater control of the field oxide oxidation mask edge. The invention herein described provides a foot with a continuous transition of flexibility from its tip to the main portion of the mask. The risk of cracking at the foot/mask interface is also reduced. In addition, the invention eliminates process steps required by Jang for spacer removal to provide a flexible foot for the field oxidation.

Chiu et.al., U.S. Pat. No. 5,470,783 shows the formation of a nitride foot at the base of the main nitride oxidation mask used for the formation of recessed oxide isolation. The foot is not tapered and functions to reduce the oxidation window of the opening, thereby reducing penetration of the recessed oxide under the main portion of the mask.

SUMMARY OF THE INVENTION

It is an object of this invention to provide a method for forming a field oxide isolation compatible with sub-half-micron device technology having reduced stress induced dislocations.

It is another object of this invention to provide a method for forming a field oxide isolation having a smooth surface topology at its periphery, thereby improving step coverage of subsequently deposited conductive layers.

It is yet another object of this invention to provide a method for forming a field oxide isolation with improved minimal birds beak encroachment into device active areas.

It is still another object of this invention to provide a method for suppressing the field oxide thinning effect which occurs when field oxide is grown between narrow mask spacings.

It is still another object of this invention to provide a method for suppressing the oxide punch through effect which occurs when field oxide is grown between narrow mask spacings.

It is yet another object of this invention to describe a novel oxidation mask which will yield an improved field oxide isolation for use with sub half-micron integrated circuit technology.

It is still another object of this invention to provide a method for forming an oxidation mask having a flexible foot with reduced risk of cracking of the foot at its junction with the main portion of the oxidation mask.

These objects are accomplished by the use of a novel oxidation mask for growing the field oxide isolation. The mask is so designed that its stiffness increases continuously from its outermost edge to its main body over a distance wherein a thick subjacent field oxide narrows towards a silicon active area. The continuously decreasing is flexibility is made possible by a tapered foot at the mask edge. The gradually increasing stiffness towards the main body of the mask permits a smoother transition of stress components than those provided by prior art mask edges which have a foot of uniform thickness. The high flexibility at the mask edge permits the rapidly growing silicon oxide to expand more freely at the mask edge, thereby permitting relief of growth induced stresses. The increasing stiffness towards the main body inhibits the penetration of birds beak.

The oxidation mask is formed by first providing a wafer having a pad oxide and a thick nitride layer over the pad oxide. A photoresist mask then defines a region wherein a field oxide is to be formed. A thinner nitride layer is formed over the defined region either by thinning the thick nitride layer by partial etching with RIE or by completely etching thick nitride in the region and subsequently depositing a thin nitride layer over the wafer.

A sidewall spacer along the edge of the thick nitride is then formed by the well known technique wherein a layer of material is deposited over the wafer and blanket etched by RIE. The sidewall material used in the preferred embodiments is polysilicon although other materials may also be used. Using the sidewall as a mask, the thin nitride is etched to expose the underlying pad oxide. The tapered nitride foot structure is then formed under the sidewall spacers.

Two methods for forming the tapered foot are presented. In the first method, the tapered foot is formed concurrently with the etching of the thin nitride. In the second method the tapered foot is formed after the thin nitride is etched and during the removal of the sidewall spacer. In the first method a separate process step for the spacer removal is eliminated, thereby improving process efficiency. The second method provides better control of foot length as well as independence of foot length on nitride overetch.

BRIEF DESCRIPTION OF THE DRAWINGS

FIG. 1 is a cross sectional view of a wafer with a conventional LOCOS oxidation mask before field oxide formation.

FIG. 2 is a cross sectional view of a wafer with a conventional LOCOS oxidation mask after field oxide formation.

FIG. 3 is a cross sectional view of a wafer having a LOCOS oxidation mask with a foot at its edge according to prior art.

DESCRIPTION OF THE PREFERRED EMBODIMENTS

Figure 4:
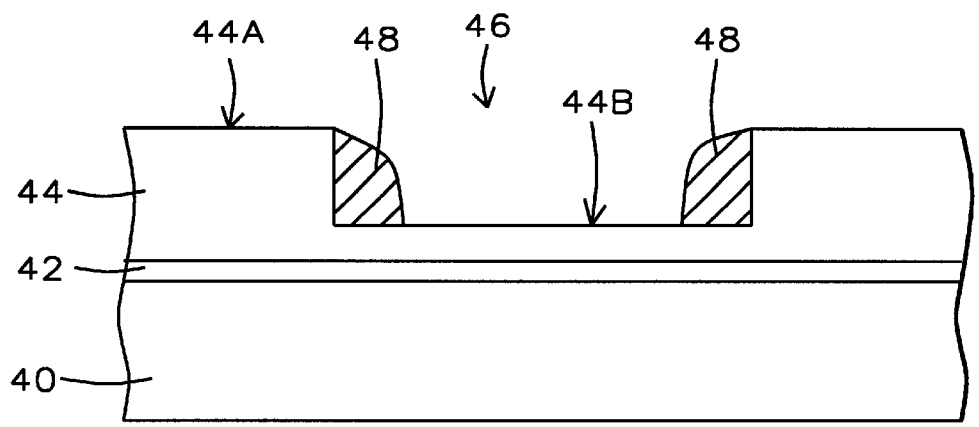
FIG. 4 is a cross sectional view of a wafer having a silicon nitride layer over a pad oxide with sidewall spacers in an opening.

Referring now to FIG. 4, a monocrystalline silicon wafer 40 is provided. A multi-layered oxidation mask is formed by first growing a layer of silicon oxide(pad oxide) 42 to a thickness of about 20 nm. by subjecting the wafer to a clean dry oxidizing ambient in a furnace at about 950° C. A silicon nitride layer 44 between about 50 and 200 nm. thick is then deposited, preferably by low pressure chemical vapor deposition (LPCVD). Using well known photolithographic methods an opening 46 is patterned in the silicon nitride layer 44. The silicon nitride layer 44 is etched by RIE until the thickness of silicon nitride 44B within the opening 46 is reduced to between about 30 to 50 nm.

A layer of polysilicon is next deposited to a thickness of between about 50 to 150 nm. and, using a blanket RIE, the sidewall spacers 48 are formed. The methods of forming sidewall spacers are well documented and familiar to those in the art.

The wafer 40 is placed in an RIE tool, for example the LAM 4428x1 manufactured by LAM Research, 4650 Cushing Parkway, Fremont, Calif. 94538, U.S.A., and etch using well known etchants containing fluorine. Typical etchant chemistries include such gases as $SF_6$, HBr, $CHF_3$, and $O_2$. A suitable etchant composition in the LAM 4428x1 tool comprises $SF_6$ at a flow rate of between about 50 and 100 SCCM, $CHF_3$ at a flow rate of between about 10 and 50 SCCM, and He as a buffer gas used in optimization of the plasma uniformity at a flow rate of between about 100 and 200 SCCM and at an rf power of between 200 and 300 watts. Etch rate ratios of polysilicon-to-silicon nitride of 3:1 or thereabout and appropriate etch profiles can be obtained by optimization of the chamber and plasma conditions using methods well known by those in the art. Similar etch performance can also be achieved by using alternate dry etch methods.

Figure 5A:
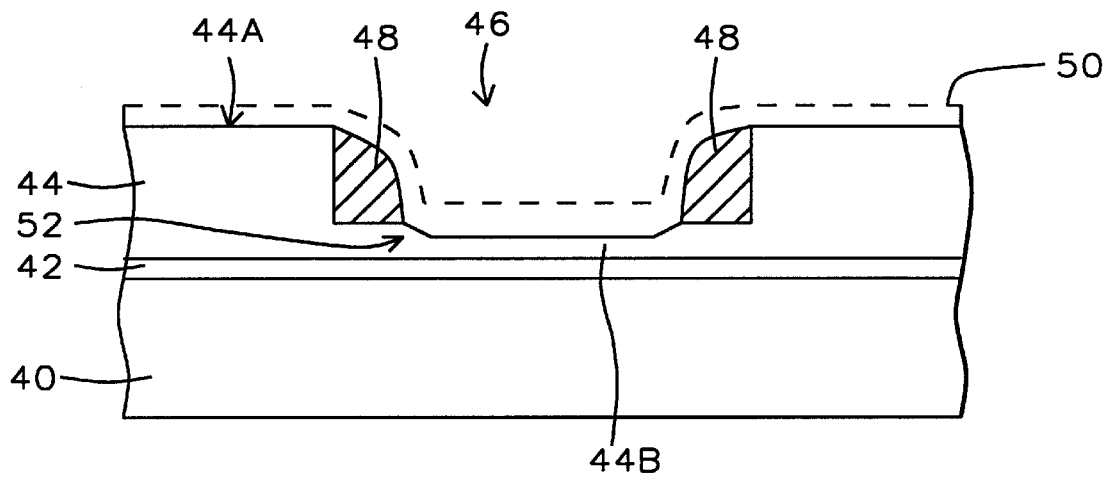
FIGS. 5A and FIG. 5B are cross sectional views of a wafer showing stages in the formation of a tapered mask foot according a first embodiment of the current invention.

During the etch step, the polysilicon spacer 48 recedes as the thin silicon nitride 44B within the opening 46 is etched away. FIG. 5A shows a cross section of the wafer during an intermediate stage of this RIE process step. Because both the silicon nitride and the polysilicon are being etched, the sidewall spacer 48 recedes as the silicon nitride 44B becomes thinner. This recession is made possible because the sidewall height is never more than about three times the width. Thus curvature of the spacer begins at or very close to its base and the spacer's width begins to recede at or shortly after the onset of etching. As the simultaneous spacer and nitride etching proceeds, a tapered foot 52 forms along the nitride initially covered by the spacer. The dashed line 50 indicates the initial profile.

Figure 5B:
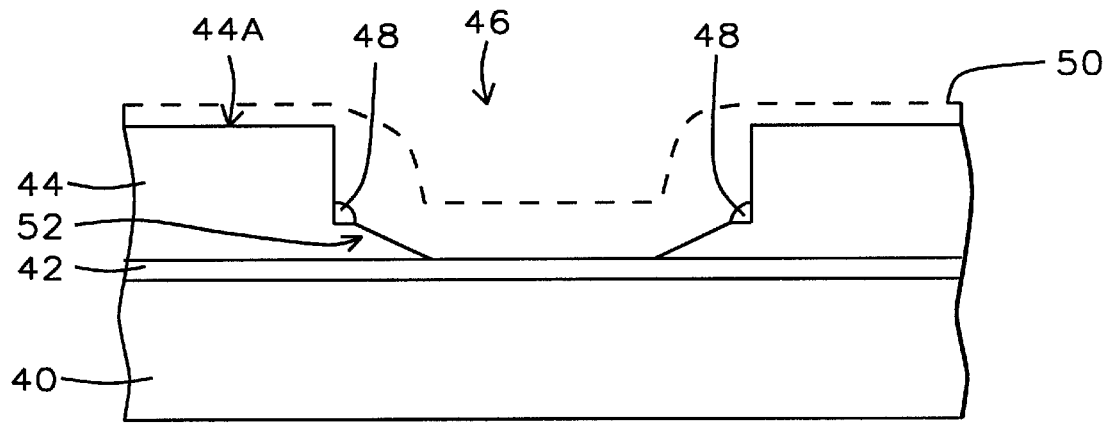

FIG. 5B shows the wafer cross section after the RIE step has been completed. The spacer 48 has either been completely removed or has receded to insignificant size. The foot 52 forms a nearly smooth transition from its tip to the thick main body 44A of the nitride layer. The endpoint of the RIE process step is determined when the nitride layer 44B has been removed within the opening 46. Excessive over etching must be avoided to prevent the recession of the nitride foot 52. Any remnants of the spacer 48 need not be removed by an additional etching step. They are converted to silicon oxide during the field oxidation and become a physical part of the oxidation mask. However, they may be removed if desired by a selective etch such as aqueous KOH.

In a second embodiment of this invention a silicon nitride oxidation mask with a tapered foot is formed by first completely etching the silicon nitride within the opening defined by the spacers and then forming a tapered foot by simultaneously etching the spacer and subjacent silicon nitride exposed by the recession of the spacer.

As in the first embodiment, referring again to FIG. 4, a monocrystalline silicon wafer 40 is provided. A multi-layered oxidation mask is formed by first growing a layer of silicon oxide(pad oxide) 42 to a thickness of about 20 nm. by subjecting the wafer to a clean dry oxidizing ambient in a furnace at about 950° C. A silicon nitride layer 44 between about 50 and 200 nm. thick is then deposited, preferably by low pressure chemical vapor deposition (LPCVD). Using well known photolithographic methods an opening 46 is patterned in the silicon nitride layer 44. The silicon nitride layer 44 is etched by RIE until the thickness of silicon nitride 44B within the opening 46 is reduced to between about 30 to 50 nm.

A layer of polysilicon is next deposited to a thickness of between about 50 to 150 nm. and, using a blanket RIE, the sidewall spacers 48 are formed. The methods of forming sidewall spacers are well documented and familiar to those in the art.

Figure 6:
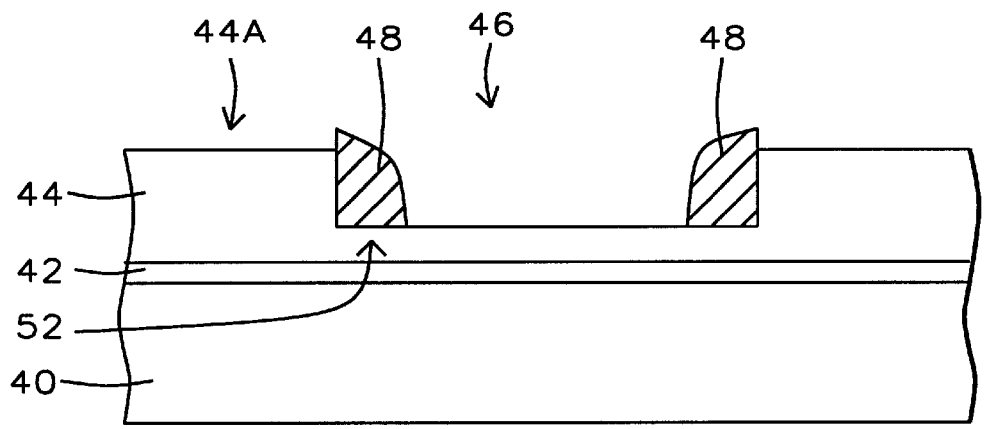
FIG. 6 is a cross sectional view of a wafer after the opening of the thin nitride layer according to the second embodiment of this invention.

The wafer 40 is placed in an RIE tool and etched using a etchant gas comprising $SF_6$ at a flow rate of between about 50 and 100 SCCM, HBr at a flow rate of between about 10 and 50 SCCM, and $O_2$ at a flow rate of between about 20 and 50 SCCM, with a carrier gas of helium. The pressure within the chamber is maintained between about 100 and 300 mTorr. During this etch step the polysilicon spacer 48 is durable and does not recede significantly as the thin silicon nitride 44B is etched away. Over-etching to assure completeness of removal of nitride in the opening is permitted in this embodiment because the foot 52 is protected by the spacer 48. However, over-etching may nor be required because additional over-etching of the thin nitride will occur during a second etch step wherein the nitride foot is formed. FIG. 6 shows a cross section of the wafer after the thin nitride layer in the opening 46 has been removed exposing the pad oxide 42. The nitride foot 52 is defined by the polysilicon spacer 48.

The spacer 48 is then etched under RIE conditions which etch both nitride and polysilicon, causing the nitride foot 52 to develop a taper as the spacer 48 recedes. A suitable etchant composition in the LAM 4428x1 tool comprises $SF_6$ at a flow rate of between about 50 and 100 SCCM, $CHF_3$ at a flow rate of between about 10 and 50 SCCM, and He as a buffer gas used in optimization of the plasma uniformity at a flow rate of between about 100 and 200 SCCM and at an rf power of between 200 and 300 watts. Etch rate ratios of polysilicon-to-silicon nitride of 3:1 or thereabout and appropriate etch profiles can be obtained by optimization of the chamber and plasma conditions using methods well known by those in the art. The duration of the etch is determined by observing endpoint by optical emission spectroscopy. Alternatively a pre-determined etch time interval may be used.

Figure 7A:
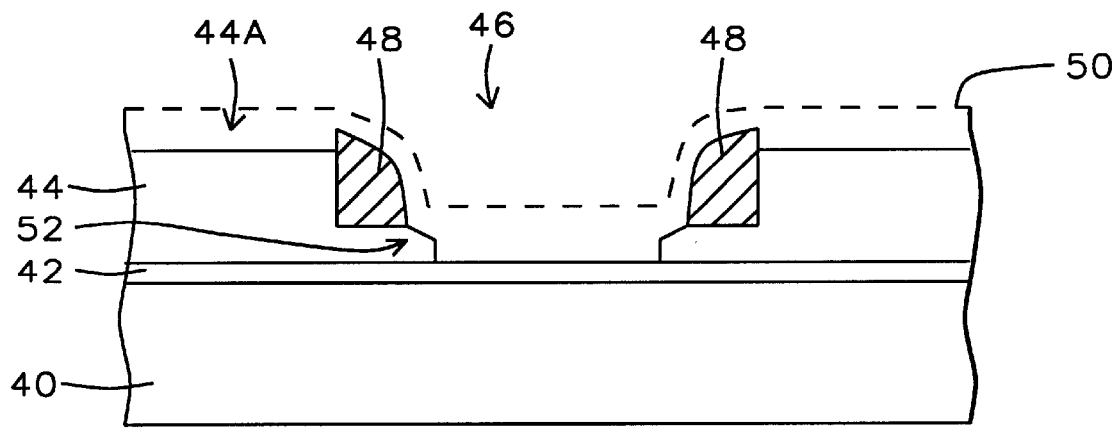
FIG. 7A and FIG. 7B are cross sectional views of a wafer showing stages wherein the spacer etch simultaneously tapers the mask foot according to a second embodiment of the current invention.

FIG. 7A shows a cross section of the wafer during an intermediate stage of this RIE process step. Because both silicon nitride and polysilicon are being etched, the sidewall spacer 48 recedes as the silicon nitride foot 52 develops a taper. This recession is made possible because the sidewall height is never more than about three times the width. Thus curvature of the spacer begins at or very close to its base and the spacer's width begins to recede at or shortly after the onset of etching. The dashed line 50 indicates the initial profile.

Figure 7B:
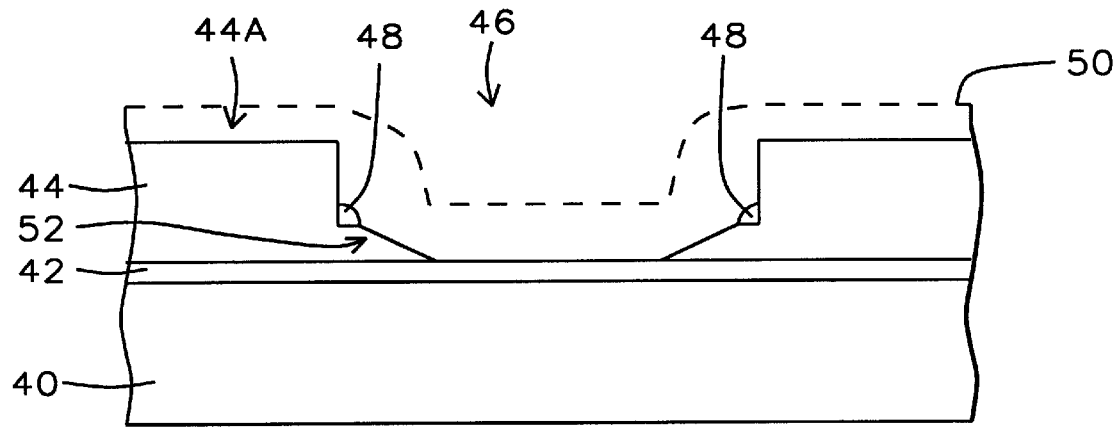

FIG. 7B shows the wafer cross section after the RIE step has been completed. The spacer 48 has either been completely removed or has receded to insignificant size. The foot 52 forms a nearly smooth transition from its tip to the thick main body 44A of the nitride layer. The endpoint of the RIE step is determined when the tip of the tapered foot 52 has reached a predetermined thickness. Over etching to assure complete removal of nitride in the opening 46 is unnecessary because complete exposure of the opening 46 was assured during the previous RIE step. Any remnants of the spacer 48 need not be removed by an additional etching step. They are converted to silicon oxide during the field oxidation and become a physical part of the oxidation mask. However, they may be removed if desired by a selective etch such as aqueous KOH.

The resultant field oxidation mask formed by the first and second embodiments are essentially identical as can be seen by comparing FIG. 5B and 7B. The choice of method depends upon factors which may relate to circuit design, such as an over etch requirement. An advantage of the second embodiment is that the thickness of the silicon nitride foot at its tip can be better controlled and is essentially independent of any nitride over-etch during the thin nitride etch step.

Figure 8:
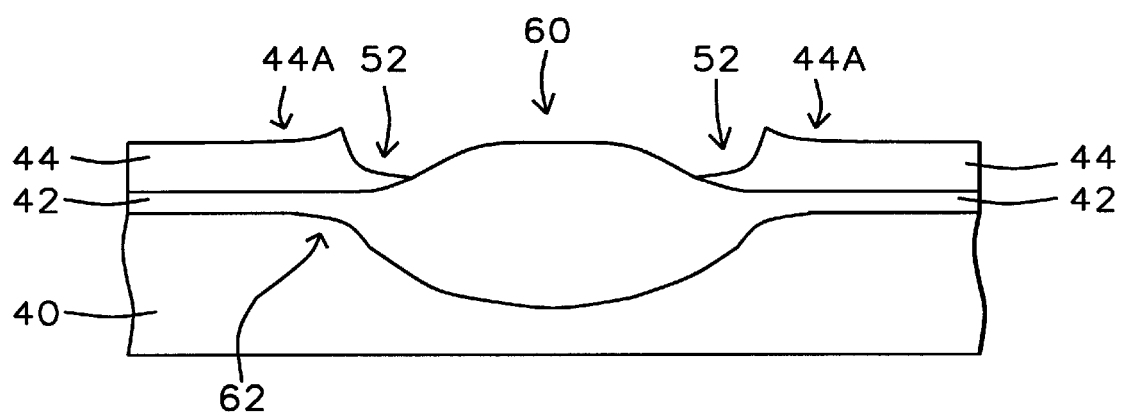
FIG. 8 is a cross sectional view of a wafer after formation of a field oxide region by thermal oxidation using the mask structure of this invention.

A field oxide isolation is next grown in a clean oxidation furnace using an ambient gas containing oxygen, either alone or in combination with water vapor, and an optional chlorine containing additive such as trichloroethane to minimized mobile ion contamination. The oxidation temperature is typically between 950° C. and 1,100° C. FIG. 8 shows a cross section of the wafer after the field oxide 60 has been formed. The edges of the silicon nitride mask 44A with the tapered foot 52 have been pushed up by the growth of oxide under the pad oxide.

The growth rate of the field oxide is governed by linear-parabolic kinetics wherein the growth rate is very rapid initially and then slows parabolically according to the diffusion of the oxidizing species. The thin tapered silicon nitride foot 52 flexes and permits the initial rapidly growing silicon oxide expand, thereby providing a means of stress relief which supplements stress relief by plastic flow. As the oxidation proceeds the growth rate decreases and the stiffer components of the silicon nitride mask come into play, thereby reducing bird beak. Additionally the tapered silicon nitride foot also produces a smooth silicon/silicon oxide profile 62 under the mask edge.

The benefits of an approximately fifty fold reduction in the shear stress component as well as the improved smoothness of edge coverage are realized by this method at the expense of a somewhat longer than conventional birds beak. This birds beak encroachment can be compensated by a lithography bias in the photomask processing. It can also be conveniently removed by a dip etch in dilute HF after the photomask is removed. Narrow channel MOS field effect transistor devices are then fabricated in and over the silicon regions adjacent to the field oxide isolation patterns.

While the invention has been particularly shown and described with reference to the preferred embodiments thereof, it will be understood by those skilled in the art that various changes in form and details may be made without departing from the spirit and scope of the invention.

Whereas in the embodiments cited the thin nitride in the defined region is formed by partially etching the thick nitride through a mask, the thin nitride can also be formed by etching the thick nitride entirely in the defined region through a mask and then depositing a thin nitride layer over the thick nitride.

What is claimed is:

1. An oxidation mask for the local oxidation of silicon comprising:

(a) a pad oxide;

(b) a silicon nitride layer over said pad oxide;

(c) an opening in said second silicon nitride layer; and (f) a silicon nitride foot connected to said silicon nitride layer along the periphery and at the base of said opening, said silicon nitride foot being tapered, and thinning away from said base towards said opening.

2. The oxidation mask of claim 1 wherein said silicon nitride layer is between about 20 and 200 nm. thick.

3. The oxidation mask of claim 1 wherein said opening is between about 350 and 600 nm. wide.

\* \* \* \* \*